(12) United States Patent
Andresen et al.

(10) Patent No.: US 10,296,669 B2
(45) Date of Patent: May 21, 2019

(54) METHOD AND DEVICE FOR ESTIMATING GRID PROPERTIES OF A POWER GRID

(71) Applicant: Siemens Aktiengesellschaft, Munich (DE)

(72) Inventors: Bjorn Andresen, Ostbirk (DK); Per Egedal, Herning (DK); Dragan Obradovic, Ottobrunn (DE); Ruxandra Scheiterer, Geretsried (DE); Andrei Szabo, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 893 days.

(21) Appl. No.: 14/318,598

(22) Filed: Jun. 28, 2014

(65) Prior Publication Data

US 2015/0025860 A1    Jan. 22, 2015

(30) Foreign Application Priority Data

Jul. 18, 2013   (EP) .................................... 13176978

(51) Int. Cl.
*G06G 7/48*    (2006.01)
*G06F 17/50*    (2006.01)
*G01R 27/16*    (2006.01)

(52) U.S. Cl.
CPC ......... *G06F 17/5009* (2013.01); *G01R 27/16* (2013.01)

(58) Field of Classification Search
None
See application file for complete search history.

(56) References Cited

U.S. PATENT DOCUMENTS 7,945,430 B2 *  5/2011  Canning ............. G06F 17/5009
                                                  703/13
9,059,927 B2 *  6/2015  Aparicio ............... H04L 41/145
(Continued)

FOREIGN PATENT DOCUMENTS

CN        101047316 A     10/2007
CN        101680922 A      3/2010
(Continued)

OTHER PUBLICATIONS

Xu, Wilsun, and Yilu Liu. "A method for determining customer and utility harmonic contributions at the point of common coupling." IEEE Transactions on Power Delivery 15.2 (2000): 804-811.*
Vasquez, Juan C., et al. "Adaptive droop control applied to voltage-source inverters operating in grid-connected and islanded modes." IEEE Transactions on Industrial Electronics 56.10 (2009): 4088-4096.*

(Continued)

*Primary Examiner* — Aniss Chad
*Assistant Examiner* — Nithya J. Moll
(74) *Attorney, Agent, or Firm* — Beusse Wolter Sanks & Maire

(57) ABSTRACT

A method for estimating grid properties of a power grid coupled to a generator at a point of common coupling is provided. First, a voltage $V_{PCC}$ at the point of common coupling is measured. Second, a current $I_{PCC}$ at the point of common coupling is measured. Third, the grid properties are estimated by a grid model using as input parameters the measured voltage $V_{PCC}$ at the point of common coupling, the measured current $I_{PCC}$ at the point of common coupling and the determined phase angle. Advantageously, the absolute phases of the voltage and the current at the point of common coupling are not necessary, which makes the present method less prone to errors due to measurement noise. Further, a device and a computer program product are provided.

19 Claims, 4 Drawing Sheets

(56) References Cited

U.S. PATENT DOCUMENTS

| | | | |
|---|---|---|---|
| 9,188,109 B2* | 11/2015 | Lazaris | ............ G06Q 30/0605 |
| 2003/0098671 A1 | 5/2003 | Hochgraf | |
| 2008/0204054 A1 | 8/2008 | Wells | |
| 2013/0148394 A1 | 6/2013 | O'Brien | |

FOREIGN PATENT DOCUMENTS

| | | |
|---|---|---|
| DE | 3600770 A1 | 11/1986 |
| DE | 19910288 A1 | 9/2000 |
| EP | 1841037 A2 | 10/2007 |

OTHER PUBLICATIONS

Pedersen K.O.H. et al: Short-circuit impedance measurement, IEE Proc.-Generation, Transmission and Distribution, vol. 150, No. 2, Mar. 2003.

Ciobotaru M. et al: Online grid impedance estimation for single-phase grid-connected systems using PQ variations, in: Power Electronics Specialists Conference, 2007. PESC 2007. IEEE, Piscataway, NJ, USA; pp. 2306-2312; ISBN 978-1-4244-0654-8; XP 031218627; Jun. 17, 2007.

Timbus A.V. et al: Line Impedance Estimation Using Active and Reactive Power Variations; in Power Electronics Specialists Conference; pp. 1273-1279; ISBN 978-1-4244-0654-8; XP 031218468; Jun. 17, 2007.

CN Office Action dated Sep. 5, 2017, for CN patent application No. 201410343097.6.

* cited by examiner

METHOD AND DEVICE FOR ESTIMATING GRID PROPERTIES OF A POWER GRID

CROSS REFERENCE TO RELATED APPLICATIONS

This application claims priority to and the benefit of European Application No. EP13176978 filed Jul. 18, 2013, incorporated by reference herein in its entirety.

FIELD OF INVENTION

The present invention relates to a method and to a device for estimating grid properties of a power grid. Further, the present invention relates to a method and to an apparatus for controlling a generator coupled to a power grid as well as to a method and to an apparatus for operating a power grid.

BACKGROUND OF INVENTION

The grid properties of an electric power grid particularly include the grid impedance and the grid voltage. For example, these grid properties may be estimated by a Thevenin equivalent model of the electric grid.

Thevenin's theory holds, to illustrate in DC circuit theory terms, that any linear electric network, here the electric power grid, with voltage and current sources, like generators and solar plants, and resistances can be replaced at terminals, here the point of common coupling, by an equivalent voltage source, here the grid voltage, in series connection with an equivalent resistance, here the grid impedance. The equivalent voltage is the voltage obtained at the point of common coupling in an open circuit. The equivalent resistance, here the grid impedance, is the resistance obtained at the point of common coupling with all its independent current sources open-circuited and all its independent voltage sources short-circuited.

Conventionally, the grid properties of a power grid are estimated by driving the system to different steady-state points where the current and the voltage are measured, both the amplitude and the absolute phase of both variables. One problem here is the imprecision of the measurements of the absolute phase changes between different operating points due to frequency variations. In such a case, it may be enough to have two operating points for identifying the grid model, but more points may be used to minimize the error due to measurement noise. On the other hand, the problem regarding the absolute phase changes remains.

For example, K. O. H. Pedersen, A. H. Nielsen and N. K. Poulsen describe in the article "Short-circuit impedance measurement" methods for estimating the short-circuit impedance in the power grid for various voltage levels and situations. The short-circuit impedance is measured, preferably based on naturally occurring load changes in the grid. They show that such a measurement system faces different kinds of problems at different locations in the grid. This means that the best measurement methodology changes depending on the location in the grid. Three typical examples with different measurement programs at 400 kV, 132 kV and 400 V voltage level are discussed there.

SUMMARY OF INVENTION

Accordingly, it is an object of the present invention to provide an improved estimation of the grid properties of a power grid coupled to a generator.

According to a first aspect, a method for estimating grid properties of a power grid coupled to a generator at a point of common coupling PCC is provided. In a first step, a voltage $V_{PCC}$ at the point of common coupling is measured. In a second step, a current $I_{PCC}$ at the point of common coupling is measured. In a third step, the grid properties are estimated by a grid model using as input parameters the measured voltage $V_{PCC}$ at the point of common coupling, the measured current $I_{PCC}$ at the point of common coupling and the determined phase angle.

In the present method, the grid properties are estimated based on the measured voltage $V_{PCC}$, the measured current $I_{PCC}$ and the determined phase angle between the voltage $V_{PCC}$ and the current $I_{PCC}$. Thus, the absolute phases of the voltage $V_{PCC}$ and the current $I_{PCC}$ are not necessary, which makes the present method less prone to errors due to measurement noise. In particular, the minimum number of operating points needed here is three, but more operating points may be used to mitigate the influence of noise.

By means of the present method it is possible to formulate a grid estimation problem as a solution of a set of quadratic polynomial equations whose coefficients are functions of the amplitude of the voltage $V_{PCC}$, the amplitude of the current $I_{PCC}$ and the relative phase angle (or equivalently the magnitude of $V_{PCC}$, the active power as well as the reactive power). Details for both are given in the following detailed description.

In case of three operating points, the solution may also be found either analytically or numerically by applying appropriate equation solvers.

According to an embodiment, the grid properties include a grid impedance $Z_G$ and a grid voltage $V_G$ of the power grid.

Both, the estimated grid impedance and the estimated grid voltage may be of use for different technical applications. For example, the grid properties may be used for controlling a generator coupled to a power grid, wherein the generator is controlled in dependence on the estimated grid properties. Further, the estimated grid properties may be used to operate the power grid in dependence on said estimated grid properties.

According to a further embodiment, the voltage $V_{PCC}$ at the point of common coupling and the current $I_{PCC}$ at the point of common coupling are measured at a fundamental frequency of the power grid. For example, the fundamental frequency is 50 Hz.

According to a further embodiment, the method includes the following steps:

a) measuring the voltage $V_{PCC}$ at the point of common coupling PCC at N different working points of the power grid, $N \geq 3$, b) measuring the current $I_{PCC}$ at the point of common coupling PCC at the N different working points, c) determining the phase angle $\alpha$ between the measured voltage $V_{PCC}$ at the point of common coupling PCC and the measured current $I_{PCC}$ at the point of common coupling PCC for each of the N different working points, and d) estimating the grid properties by the grid model using as input parameters the measured voltage $V_{PCC}$ at the point of common coupling PCC, the measured current $I_{PCC}$ at the point of common coupling PCC and the determined phase angle $\alpha$ for the N different working points.

In particular, method steps a) to c) may be executed iteratively. The number of iterations is defined by N. Each iteration step of steps a) to c) provides a tuple of $\{V_{PCC}, I_{PCC}, \alpha\}$. Based on said N tuples $\{V_{PCC}, I_{PCC}, \alpha\}$, the grid properties are estimated in step d).

In particular, step d) includes eliminating the absolute phases of the measured voltage $V_{PCC}$ at the point of common coupling and the measured current $I_{PCC}$ at the point of common coupling.

Two examples for eliminating the absolute phases of the voltage $V_{PCC}$ at the point of common coupling and the current $I_{PCC}$ at the point of common coupling are given in the detailed description of FIG. 3.

According to a further embodiment, the grid properties include a resistive part R of the grid impedance $Z_G$, a reactive part X of the grid impedance $Z_G$ and the grid voltage $V_G$ of the power grid.

According to a further embodiment, the resistive part R of the grid impedance $Z_G$, the reactive part X of the grid impedance $Z_G$ and the grid voltage $V_G$ are determined by solving the following equation for three different working points:

$$(V_G)^2 = |V_{PCC}(i)|^2 + (R^2+X^2) \cdot |I_{PCC}(i)|^2 - 2 \cdot |V_{PCC}(i)| \cdot |I_{PCC}(i)| \cdot (R \cdot \cos(\alpha(i)) + X \cdot \sin(\alpha(i)))$$

i=1,2,3;

In the above equation, $V_{PCC}$ indicates the measured voltage at the point of common coupling PCC, $I_{PCC}$ indicates the measured current at the point of common coupling PCC, and a indicates the determined phase angle between the measured voltage $V_{PCC}$ at the point of common coupling PCC and the measured current $I_{PCC}$ at the point of common coupling PCC.

In the above equation, no absolute phases of the voltage $V_{PCC}$ at the point of common coupling and the current $I_{PCC}$ at the point of common coupling are used. As a result, the present method is less prone to errors due to measurement noise. A detailed derivation of the above equation is given in the detailed description of the Figures.

According to a further embodiment, the resistive part R of the grid impedance $Z_G$, the reactive part X of the grid impedance $Z_G$ and the grid voltage $V_G$ are determined by solving the following equation for three different working points:

$$(V_G)^2 = |V_{PCC}(i)|^2 + (R^2 + X^2) \cdot \frac{(P^2(i) + Q^2(i))}{|V_{PCC}(i)|^2} - 2 \cdot (R * P(i) X * Q(i)),$$

$$i = 1, 2, 3$$

In the above equation, $V_{PCC}$ indicates the voltage at the point of common coupling PCC, P indicates the active power injected at the point of common coupling PCC, and Q indicates the reactive power injected at the point of common coupling PCC.

This equation is an equivalent formulation to the above equation. In the above equation, no absolute phases of the voltage $V_{PCC}$ at the point of common coupling and the current $I_{PCC}$ at the point of common coupling are used. As a result, the present method is less prone to errors due to measurement noise. A detailed revelation of above equation is given in the detailed description of the Figures.

According to a further embodiment, the generator is a wind turbine coupled at the point of common coupling to a low-voltage power grid.

Any embodiment of the first aspect may be combined with any embodiment of the first aspect to obtain another embodiment of the first aspect.

According to a second aspect, the invention relates to a computer program product comprising a program code for executing the above discussed method for estimating grid properties of a power grid coupled to a generator at a point of common coupling when run on at least one computer.

A computer program product, like a non-transitory computer-readable media, may be embodied as a memory card, USB stick, CD-ROM, DVD or as a file which may be downloaded from a server in a network. For example, this may be provided by transferring the respective file with the computer program product from a wireless communication network.

According to a third aspect, a device for estimating grid properties of a power grid coupled to a generator at a point of common coupling is provided. The device includes a first sensor, a second sensor, a determiner, and a processor. The first sensor is configured to measure a voltage $V_{PCC}$ at the point of common coupling. The second sensor is configured to measure a current $I_{PCC}$ at the point of common coupling. The determiner is configured to determine a phase angle $\alpha$ between the measured voltage $V_{PCC}$ at the point of common coupling and the measured current $I_{PCC}$ at the point of common coupling. Further, the processor is configured to estimate the grid properties by a grid model using as input parameters the measured voltage $V_{PCC}$ at the point of common coupling, the measured current $I_{PCC}$ at the point of common coupling and the determined phase angle $\alpha$.

According to a fourth aspect, a method for controlling a generator coupled to a power grid by a point of common coupling is provided. In a first step, the grid properties of the power grid are estimated according to a method of above mentioned first aspect. In a second step, the generator is controlled in dependence on or based on the estimated grid properties.

According to a fifth aspect, the invention relates to a computer program product comprising a program code for executing the above discussed method for controlling a generator coupled to a power grid by a point of common coupling when run on at least one computer.

According to a sixth aspect, an apparatus for controlling a generator coupled to a power grid by a point of common coupling is provided. The apparatus includes a device for estimating grid properties of the power grid according to the above mentioned third aspect. Moreover, the apparatus includes a controller for controlling the generator in dependence on the estimated grid properties.

According to a seventh aspect, a method for operating a power grid coupled to a generator by a point of common coupling is provided. In a first step, the grid properties of the power grid are estimated according to a method of above mentioned first aspect. In a second step, the power grid is operated in dependence on the estimated grid properties. In particular, the power grid is controlled based on the estimated grid properties.

According to an eighth aspect, an apparatus for operating a power grid coupled to a generator at a point of common coupling is provided. The apparatus includes a device for estimating grid properties of the power grid according to the above mentioned third aspect. Moreover, the apparatus includes an operating entity for operating the power grid in dependence on the estimated grid properties. The operating entity may be a controller. This controller may be adapted to control the power grid based on the estimated grid properties.

The respective means, e.g. the determiner, the processor or a controller, may be implemented in hardware and/or in software. If said means are implemented in hardware, it may be embodied as a device, e.g. as a computer or as a processor or as a part of a system, e.g. a computer system. If said means are implemented in software it may be embodied as a computer program product, as a function, as a routine, as a program code or as an executable object.

BRIEF DESCRIPTION OF THE DRAWINGS

Further objects, features and advantages of the present invention will become apparent from the subsequent description and depending claims, taking in conjunction with the accompanying drawings, in which:

DETAILED DESCRIPTION OF INVENTION

Figure 1:
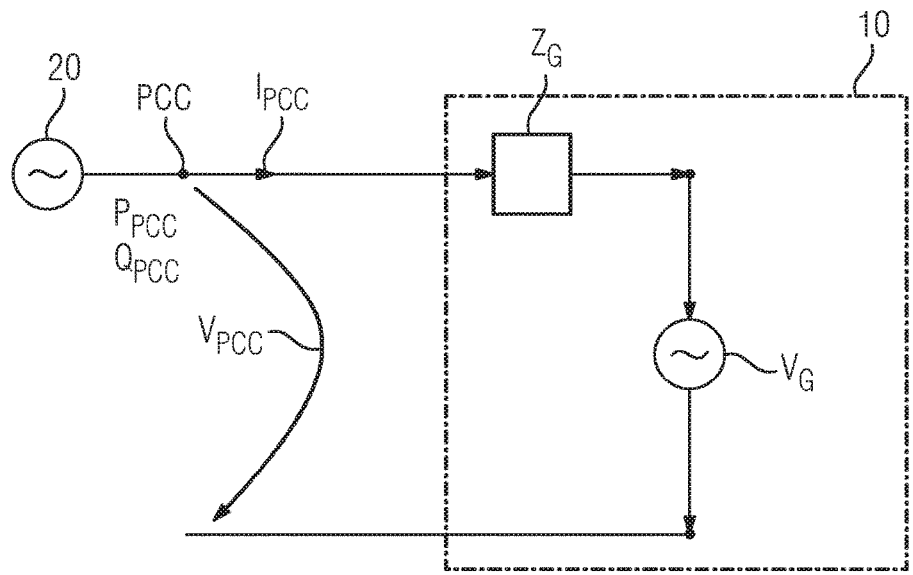
FIG. 1 shows an equivalent model of a power grid coupled to a generator at a point of common coupling.

In the Figures, like reference numerals designate like or functionally equivalent elements, unless otherwise indicated.

Further, in the Figures, the following symbols are used for discussing said embodiments for estimating grid properties of a power grid coupled to a generator at a point of common coupling:

| Symbol | Definition | Type | Measured/ Unknown/determined from measurements |
|---|---|---|---|
| $V_G$ | Grid voltage, used as reference for the phase | real | Unknown |
| $Z_G$ | Grid impedance | complex | unknown |
| R | Resistive part of $Z_G$ | real | unknown |
| X | Reactive part of $Z_G$ | real | Unknown |
| $Z_G = R + j * X$ | | | |
| $V_{PCC}$ | Voltage at the point of common coupling | complex | Partially unknown |
| $|V_{PCC}|$ | Magnitude of $V_{PCC}$ | real | Measured |
| θ | Phase of $V_{PCC}$ with respect to $V_G$ | Real | unknown |
| $V_{PCC} = |V_{PCC}|e^{j*\theta}$ | | | |
| $I_{PCC}$ | Current injected at the point of common coupling | complex | partially unknown |
| $|I_{PCC}|$ | Magnitude of $I_{PCC}$ | real | Measured |
| φ | Phase of $I_{PCC}$ with respect to $V_G$ | real | unknown |
| $I_{PCC} = |I_{PCC}| e^{j*\varphi}$ | | | |
| α | Phase between voltage and current | real | measured |
| α = θ − φ | | | |
| $P_{PCC}$ | Active power injected at PCC | real | determined |
| $P_{PCC} = |U_{PCC}| * |I_{PCC}| * \cos(\alpha)$ | | | |
| $Q_{PCC}$ | Reactive power injected at PCC | real | determined |
| $Q_{PCC} = |U_{PCC}| * |I_{PCC}| * \sin(\alpha)$ | | | |
| $S_{PCC}$ | Apparent power injected at PCC | Complex | determined |
| $S_{PCC} = P_{PCC} + j * Q_{PCC} = U_{PCC} * \mathrm{conj}(I_{PCC})$ | | | |

In this regard, FIG. 1 shows an equivalent model of a power grid 10 coupled to a generator 20 at a point of common coupling PCC.

As illustrated in FIG. 1, the power grid 10 is modelled by its grid impedance $Z_G$ and its grid voltage $V_{PCC}$ at the point of common coupling PCC. At the point of common coupling PCC, the voltage $V_{PCC}$ at the PCC, the current $I_{PCC}$ injected at the PCC, the active power $P_{PCC}$ injected at the PCC, and the reactive power $Q_{PCC}$ injected at the PCC are depicted.

Figure 2:
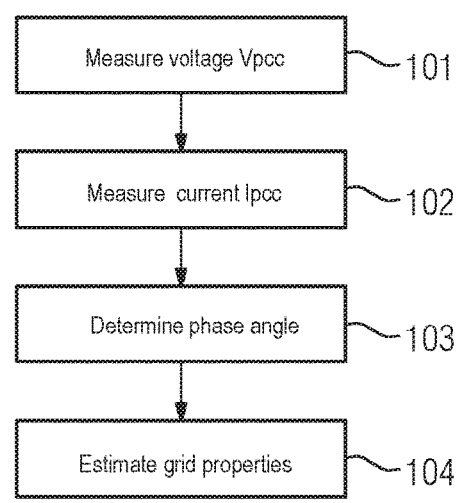
FIG. 2 shows a first embodiment of a sequence of method steps for estimating grid properties of a power grid coupled to a generator.

Further, FIG. 2 shows a first embodiment of a sequence of method steps for estimating grid properties $Z_G$, $V_G$ of the power grid 10 coupled to the generator 20 at the point of common coupling PCC as shown in FIG. 1.

In particular, the power grid 10 is a low-voltage power grid, and the generator 20 is a wind turbine coupled to the low-voltage power grid 10 at the point of common coupling PCC.

The method of FIG. 2 comprises the steps 101-104:

In step 101, the voltage $V_{PCC}$ at the point of common coupling PCC is measured. In step 102, the current $I_{PCC}$ at the point of common coupling PCC is measured.

In particular, the voltage $V_{PCC}$ and the current $I_{PCC}$ are measured at a fundamental frequency of the power grid 10. For example, the fundamental frequency of the power grid 10 is 50 Hz.

In step 103, the phase angle α between the measured voltage $V_{PCC}$ and the measured current $I_{PCC}$ is determined.

In step 104, the grid properties $Z_G$, $V_G$ are estimated or determined by a grid model. The grid model uses the measured voltage $V_{PCC}$, the measured current $I_{PCC}$ and the determined phase angle α. The grid properties include the grid impedance $Z_G$ and the grid voltage $V_G$ of the power grid 10.

Figure 3:
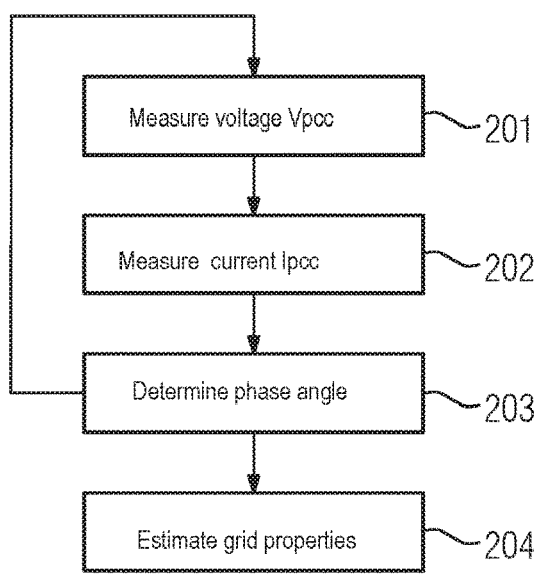
FIG. 3 shows a second embodiment of a sequence of method steps for estimating grid properties of a power grid coupled to a generator.

FIG. 3 shows a second embodiment of a sequence of method steps for estimating grid properties $Z_G$, $V_G$ of the power grid 10.

The method of FIG. 3 includes the method steps 201-204. In this regard, the method steps 201-203 are executed for at least three times at different working points of the system. For example, the system of FIG. 1 including the power grid 10 and the generator 20 coupled at the point of common coupling PCC is driven to the at least three working points, where the voltage $V_{PCC}$ is measured (step 201), the current $I_{PCC}$ is measured (step 202) and the phase angle α between the measured $V_{PCC}$ and the measured $I_{PCC}$ is determined.

As a result of method steps 201-203, there are at least three tuples of $\{V_{PCC}, I_{PCC}, \alpha\}$. Based on the tuples $\{V_{PCC}, I_{PCC}, \alpha\}$, in step 204, the grid properties $Z_G$, $V_G$ are estimated or determined by a grid model. The grid model uses as input tuples of $V_{PCC}$, $I_{PCC}$, and α determined at a minimum of three different working points.

Within said step 204, the absolute phases ϑ, φ of $V_{PCC}$ and $I_{PCC}$ are not used. In the following, this is explained for two different examples in which ϑ, φ are eliminated. In these two examples, the resistive part R of the grid impedance $Z_G$, the reactive part X of the grid impedance $Z_G$ and the grid voltage $V_G$ are determined.

According to a first example, with respect to FIG. 1, the resistive part R, the reactive part X and the grid voltage $V_G$ may be determined by a first formulation with the voltage magnitude $|V_{PCC}|$, the current magnitude $|I_{PCC}|$ and the phase α between the voltage $V_{PCC}$ at the point of common coupling and the current $I_{PCC}$ at the point of common coupling:

$$V_{PCC}(i) = V_G + Z_G \cdot I_{PCC}(i) \Rightarrow |V_{PCC}(i)|\exp(j\varphi(i))$$
$$= V_G + Z_G \cdot |I_{PCC}(i)|\exp(j\theta(i))$$

$$V_G \exp(-j\theta(i)) = |V_{PCC}(i)|\exp(j[\varphi(i) - \theta(i)]) - Z_G \cdot |I_{PCC}(i)|$$

$$|V_G|^2 = (V_G \exp(-j\theta(i))) \cdot (V_G \exp(-j\theta(i)))^* =$$
$$= (|V_{PCC}(i)|\exp(j[\varphi(i) - \theta(i)]) - Z_G \cdot |I_{PCC}(i)|) \cdot$$
$$(|V_{PCC}(i)|\exp(j[\varphi(i) - \theta(i)]) - Z_G \cdot |I_{PCC}(i)|)^* =$$
$$= |V_{PCC}(i)|^2 + |Z_G|^2 \cdot |I_{PCC}(i)|^2 - 2 \cdot |V_{PCC}(i)| \cdot$$
$$|I_{PCC}(i)| \cdot \operatorname{Re}(Z_G^* \cdot \exp(j[\varphi(i) - \theta(i)])) =$$
$$= |V_{PCC}(i)|^2 + |Z_G|^2 \cdot |I_{PCC}(i)|^2 - 2 \cdot |V_{PCC}(i)| \cdot$$
$$|I_{PCC}(i)| \cdot (R \cdot \cos(\alpha(i)) + X \cdot \sin(\alpha(i)))$$

$$\Rightarrow (V_G)^2 = |V_{PCC}(i)|^2 + (R^2 + X^2) \cdot |I_{PCC}(i)|^2 -$$
$$2 \cdot |V_{PCC}(i)| \cdot |I_{PCC}(i)| \cdot (R \cdot \cos(\alpha(i)) + X \cdot \sin(\alpha(i)))$$

$$i = 1, 2, 3; \alpha(i) = [\varphi(i) - \theta(i)]$$

According to a second example, and with respect to FIG. 1, R, X, $V_G$ may be determined by a second formulation with the voltage magnitude $|V_{PCC}|$, the reactive power P (or $P_{PCC}$) and the reactive power Q (or $Q_{PCC}$):

$$V_{PCC}(i) = V_G + Z_G \cdot I_{PCC}(i) = V_G + Z_G \cdot \left(\frac{S_{PCC}(i)}{V_{PCC}(i)}\right)^*$$

$$|V_G|^2 = V_G \cdot V_G^* =$$
$$= \left(V_{PCC}(i) - Z_G \cdot \left(\frac{S_{PCC}(i)}{V_{PCC}(i)}\right)^*\right) \cdot \left(V_{PCC} - Z_G \cdot \left(\frac{S_{PCC}(i)}{V_{PCC}(i)}\right)^*\right)^* =$$
$$= |V_{PCC}(i)|^2 + |Z_G|^2 \frac{|S_{PCC}(i)|^2}{|V_{PCC}(i)|^2} - 2 \cdot \operatorname{Re}\left(Z_G \cdot (V_{PCC})^* \cdot \left(\frac{S_{PCC}(i)}{V_{PCC}(i)}\right)^*\right) =$$
$$= |V_{PCC}(i)|^2 + |Z_G|^2 \frac{|S_{PCC}(i)|^2}{|V_{PCC}(i)|^2} - 2 \cdot \operatorname{Re}(Z_G \cdot S_{PCC}^*(i)) = |V_G|^2$$
$$= |V_{PCC}(i)|^2 + |Z_G|^2 \frac{|S_{PCC}(i)|^2}{|V_{PCC}(i)|^2} - 2 \cdot \operatorname{Re}(Z_G \cdot S_{PCC}^*(i))$$

$$\Rightarrow (V_G)^2 =$$

$$|V_{PCC}(i)|^2 + (R^2 + X^2) \cdot \frac{(P^2(i) + Q^2(i))}{|V_{PCC}(i)|^2} - 2 \cdot (R * P(i) + X * Q(i))$$

$$i = 1, 2, 3$$

Figure 4:
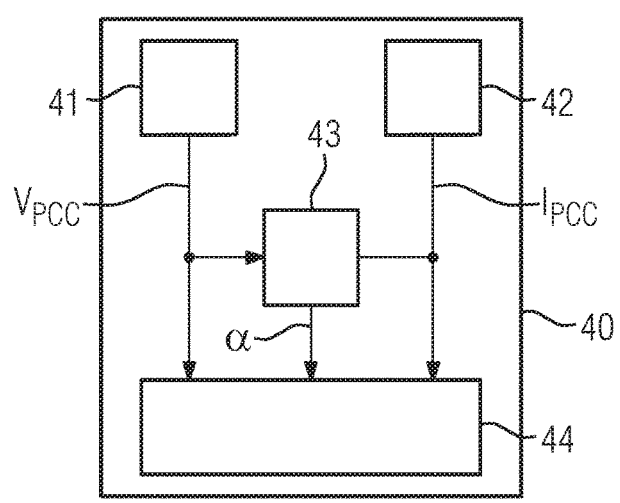
FIG. 4 shows a schematic block diagram of an embodiment of a device for estimating grid properties of a power grid coupled to a generator.

In FIG. 4, a schematic block diagram of an embodiment of a device 40 for estimating grid properties $Z_G$, $V_G$ of a power grid 10 coupled to a generator 20 at the point of common coupling is depicted (see FIG. 1).

The device 40 of FIG. 4 comprises a first sensor 41, a second sensor 42, a determiner 43 and a processor 44. The first sensor 41 may be coupled to the determiner 43 and the processor 44. The second sensor 42 may be coupled to the determiner 43 and the processor 44. The determiner 43 may be coupled to the processor 44.

The first sensor 41 is adapted to measure the voltage $V_{PCC}$ and the point of common coupling PCC. The second sensor 42 is adapted to measure the current $I_{PCC}$ at the point of common coupling PCC. The determiner 43 is adapted to determine the phase angle α between the measured voltage $V_{PCC}$ at the point of common coupling PCC and the measured current $I_{PCC}$ at the point of common coupling PCC.

The processor 44 is adapted to estimate or to determine the grid properties $Z_G$, $V_G$ by a grid model, said grid model using as input parameters the measured voltage $V_{PCC}$, the measured current $I_{PCC}$ and the determined phase angle α.

Figure 5:
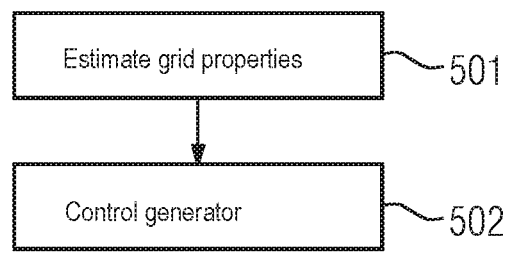
FIG. 5 shows an embodiment of a sequence of method steps for controlling a generator coupled to a power grid by a point of common coupling.

FIG. 5 shows an embodiment of a sequence of method steps for controlling a generator 20 coupled to a power grid 10 at a point of common coupling PCC. The method of FIG. 5 comprises the steps 501 and 502.

In step 501, the grid properties $V_G$, $Z_G$ of the power grid 10 are estimated. Embodiments for the estimation step 501 are given by FIGS. 2 and 3.

In step 502, the generator 20 is controlled or adjusted in dependence on the estimated grid properties $Z_G$, $V_G$. In particular, the generator 20 is controlled based on the estimated grid properties $Z_G$, $V_G$.

Figure 6:
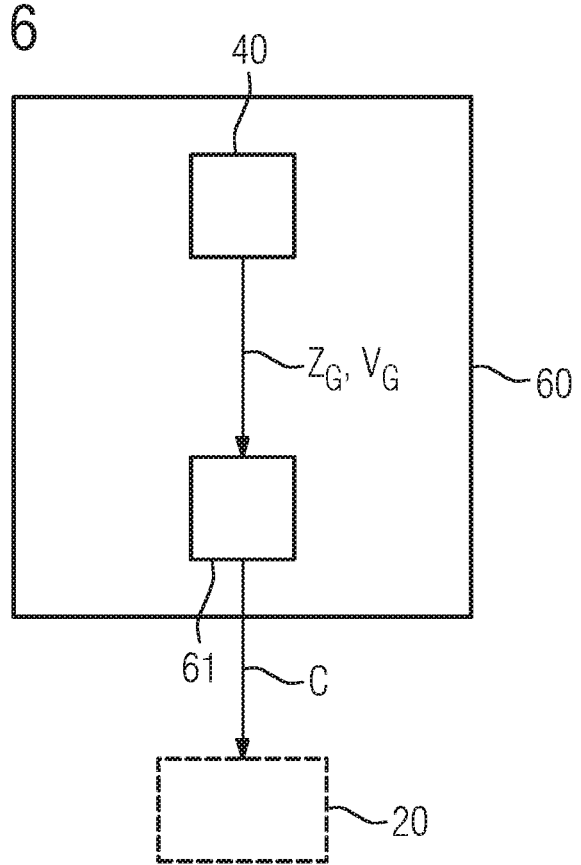
FIG. 6 shows a schematic block diagram of an embodiment of an apparatus for controlling a generator coupled to a power grid.

FIG. 6 shows as schematic block diagram of an embodiment of an apparatus 60 for controlling a generator 20 coupled to a power grid 10 at a point of common coupling PCC. The apparatus 60 of FIG. 6 comprises a device 40 for estimating grid properties $Z_G$, $V_G$ of the power grid 10. An example for such a device 40 is depicted in FIG. 4.

Further, the apparatus 60 of FIG. 6 includes a controller 61 which is configured to control the generator 20 in dependence on the estimated grid properties $Z_G$, $V_G$. For controlling the generator 20, the controller 61 may use a control signal C which is generated in dependence on the estimated grid properties $Z_G$, $V_G$.

Figure 7:
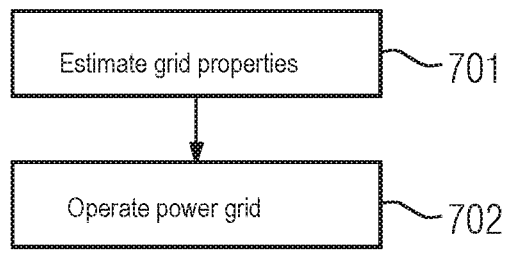
FIG. 7 shows an embodiment of a sequence of method steps for operating a power grid coupled to a generator.

FIG. 7 shows an embodiment of a sequence of method steps for operating a power grid 10 coupled to a generator 20 at a point of common coupling PCC.

In step 701, the grid properties $Z_G$, $V_G$ of the power grid 10 are estimated by a method as described with reference to FIG. 2 or FIG. 3.

In step 702, the power grid 10 is operated in dependence on the estimated grid properties $Z_G$, $V_G$. In particular, operating the power grid 10 may include diagnosis and maintenance of the power grid 10.

Figure 8:
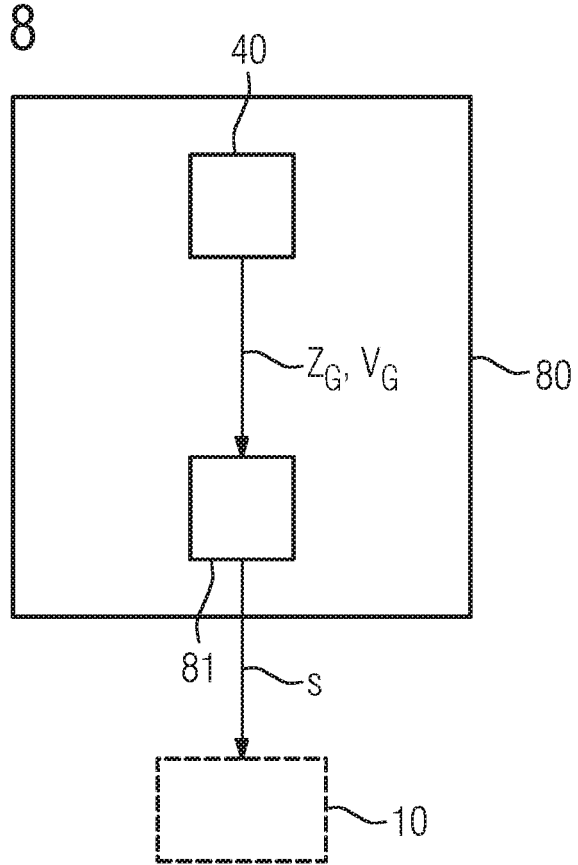
FIG. 8 shows a schematic block diagram of an embodiment of an apparatus for operating a power grid coupled to a generator.

FIG. 8 shows a schematic block diagram of an embodiment of an apparatus 80 for operating a power grid 10 coupled to a generator 20. The apparatus 80 of FIG. 8 includes a device 40 for estimating the grid properties $Z_G$, $V_G$. An example for such a device is depicted in FIG. 4.

Further, the apparatus 80 includes an operating entity 81 which is configured to operate the power grid 10 in dependence on the estimated grid properties $Z_G$, $V_G$. The operating entity 81 may be embodied as a controller or a processor. For controlling the power grid 10, the controller may use a control signal S which may be generated based on the estimated grid properties $V_G$, $Z_G$.

Although the present invention has been described in accordance with preferred embodiments, it is obvious for a person skilled in the art that modifications are possible in all embodiments.

The invention claimed is:

1. A method of controlling a generator of a power grid, comprising:
   measuring, by a device, a magnitude of a voltage ($V_{PCC}$) and a magnitude of a current ($I_{PCC}$) at a point of common coupling (PCC) coupled to a generator of a power grid;

determining a phase angle (α) between the voltage ($V_{PCC}$) at the point of common coupling (PCC) and the current ($I_{PCC}$) at the point of common coupling (PCC);

estimating, by a processor of the device, grid properties ($Z_G$, $V_G$) by a grid model using as input parameters the magnitude of the voltage ($V_{PCC}$) at the point of common coupling (PCC), the magnitude of the current ($I_{PCC}$) at the point of common coupling (PCC) and the phase angle α;

generating, by the device, a control signal representative of the estimated grid properties; and controlling the generator by a controller, wherein the controller is configured to control the generator in dependence on the estimated grid properties ($Z_G$, $V_G$) using the control signal.

2. The method of claim 1,
wherein the grid properties ($Z_G$, $V_G$) include grid impedance ($Z_G$) and a grid voltage ($V_G$) of the power grid.

3. The method of claim 1,
wherein the voltage ($V_{PCC}$) at the point of common coupling (PCC) and the current ($I_{PCC}$) at the point of common coupling (PCC) are measured at a fundamental frequency of the power grid.

4. The method of claim 1, further comprising:
a) measuring the voltage ($V_{PCC}$) at the point of common coupling (PCC) at N different working points of the power grid, N≥3,
b) measuring the current ($I_{PCC}$) at the point of common coupling (PCC) at the N different working points,
c) determining the phase angle (α) between the measured voltage ($V_{PCC}$) at the point of common coupling (PCC) and the measured current ($I_{PCC}$) at the point of common coupling (PCC) for each of the N different working points, and
d) estimating the grid properties ($Z_G$, $V_G$) by the grid model using as input parameters the measured voltage ($V_{PCC}$) at the point of common coupling (PCC), the measured current ($I_{PCC}$) at the point of common coupling (PCC) and the phase angle (α) for the N different working points.

5. The method of claim 4,
wherein step d) includes eliminating absolute phases of the measured voltage ($V_{PCC}$) at the point of common coupling (PCC) and the measured current ($I_{PCC}$) at the point of common coupling (PCC).

6. The method of claim 4,
wherein the grid properties ($Z_G$, $V_G$) include a resistive part (R) of the grid impedance ($Z_G$), a reactive part (X) of the grid impedance ($Z_G$) and the grid voltage ($V_G$) of the power grid.

7. The method of claim 6,
wherein the resistive part (R) of the grid impedance ($Z_G$), the reactive part (X) of the grid impedance ($Z_G$) and the grid voltage ($V_G$) are determined by solving the following equation for three different working points:

$$(V_G)^2 = |V_{PCC}(i)|^2 + (R^2 + X^2) \cdot |I_{PCC}(i)|^2 - 2 \cdot |V_{PCC}(i)| \cdot |I_{PCC}(i)| \cdot (R \cdot \cos(\alpha(i)) + X \cdot \sin(\alpha(i)))$$

i=1,2,3;

wherein $V_{PCC}$ indicates the measured voltage at the point of common coupling (PCC), $I_{PCC}$ indicates the measured current at the point of common coupling (PCC), and α indicates the phase angle between the measured voltage at the point of common coupling (PCC) and the measured current at the point of common coupling (PCC).

8. The method of claim 6,
wherein the resistive part (R) of the grid impedance ($Z_G$), the reactive part (X) of the grid impedance ($Z_G$) and the grid voltage ($V_G$) are determined by solving the following equation for three different working points:

$$(V_G)^2 = |V_{PCC}(i)|^2 + (R^2 + X^2) \cdot \frac{(P^2(i) + Q^2(i))}{|V_{PCC}(i)|^2} - 2 \cdot (R * P(i) X * Q(i)),$$

$$i = 1, 2, 3$$

wherein $V_{PCC}$ indicates the voltage at the point of common coupling (PCC), P indicates the active power injected at the point of common coupling (PCC) being determined as a function of the phase angle, and Q indicates the reactive power injected at the point of common coupling (PCC) being determined as a function of the phase angle.

9. The method of claim 1,
wherein the generator is a wind turbine coupled by the point of common coupling (PCC) to a low-voltage power grid.

10. The method of claim 1, further comprising:
operating the power grid in dependence on the estimated grid properties ($Z_G$, $V_G$).

11. The method of claim 10,
wherein operating the power grid includes diagnosis and maintenance of the power grid.

12. An apparatus for controlling a generator coupled to a power grid by a point of common coupling (PCC), the apparatus comprising:
a device for estimating grid properties ($Z_G$, $V_G$) of the power grid, the device comprising:
a first sensor for measuring a magnitude of a voltage ($V_{PCC}$) at the point of common coupling (PCC);
a second sensor for measuring a magnitude of a current ($I_{PCC}$) at the point of common coupling (PCC);
a determiner for determining a phase angle (α) between the voltage ($V_{PCC}$) at the point of common coupling (PCC) and the current ($I_{PCC}$) at the point of common coupling (PCC), the determiner being coupled to the first sensor and the second sensor; and
a processor, coupled to the determiner, the first sensor and the second sensor, configured for estimating the grid properties ($Z_G$, $V_G$) by a grid model using as input parameters the magnitude of the voltage ($V_{PCC}$) from the first sensor at the point of common coupling (PCC), the magnitude of the current ($I_{PCC}$) from the second sensor at the point of common coupling (PCC) and the phase angle (α) from the determiner, and for generating a control signal;
a controller, coupled to the device and the generator, configured to control the generator in dependence on the estimated grid properties ($Z_G$ $V_G$) using the control signal.

13. The apparatus of claim 12, further comprising:
an operating entity embodied as a controller or a processor adapted to operate the power grid in dependence on the estimated grid properties ($Z_G$, $V_G$).

14. The apparatus of claim 13,
wherein the operating entity is adapted for diagnosis and maintenance of the power grid.

15. The apparatus of claim 12,
wherein the generator is a wind turbine coupled by the point of common coupling (PCC) to a low-voltage power grid.

16. The apparatus of claim 12,
wherein the first sensor measures the voltage ($V_{PCC}$) at the point of common coupling (PCC) at N different working points of the power grid, N≥3,
wherein the second sensor measures the current ($I_{PCC}$) at the point of common coupling (PCC) at the N different working points,
wherein the determiner determines the phase angle ($\alpha$) between the measured voltage ($V_{PCC}$) at the point of common coupling (PCC) and the measured current ($I_{PCC}$) at the point of common coupling (PCC) for each of the N different working points, and
wherein the processor estimates the grid properties ($Z_G$, $V_G$) by the grid model using as input parameters the measured voltage ($V_{PCC}$) at the point of common coupling (PCC), the measured current ($I_{PCC}$) at the point of common coupling (PCC) and the phase angle ($\alpha$) for the N different working points, and eliminates absolute phases of the measured voltage ($V_{PCC}$) at the point of common coupling (PCC) and the measured current ($I_{PCC}$) at the point of common coupling (PCC).

17. The apparatus of claim 12,
wherein the first sensor measures the voltage ($V_{PCC}$) at the point of common coupling (PCC) at N different working points of the power grid, N≥3,
wherein the second sensor measures the current ($I_{PCC}$) at the point of common coupling (PCC) at the N different working points,
wherein the determiner determines the phase angle ($\alpha$) between the measured voltage ($V_{PCC}$) at the point of common coupling (PCC) and the measured current ($I_{PCC}$) at the point of common coupling (PCC) for each of the N different working points, and wherein the processor estimates the grid properties ($Z_G$, $V_G$) by the grid model using as input parameters the measured voltage ($V_{PCC}$) at the point of common coupling (PCC), the measured current ($I_{PCC}$) at the point of common coupling (PCC) and the phase angle ($\alpha$) for the N different working points, wherein the grid properties ($Z_G$, $V_G$) include a resistive part (R) of the grid impedance ($Z_G$), a reactive part (X) of the grid impedance ($Z_G$) and the grid voltage ($V_G$) of the power grid.

18. The apparatus of claim 17,
wherein the resistive part (R) of the grid impedance ($Z_G$), the reactive part (X) of the grid impedance ($Z_G$) and the grid voltage ($V_G$) are determined by solving the following equation for three different working points:

$$(V_G)^2 = |V_{PCC}(i)|^2 + (R^2+X^2)\cdot|I_{PCC}(i)|^2 - 2\cdot|V_{PCC}(i)|\cdot|I_{PCC}(i)|\cdot(R\cdot\cos(\alpha(i))+X\cdot\sin(\alpha(i)))$$

i=1,2,3;
wherein $V_{PCC}$ indicates the measured voltage at the point of common coupling (PCC), $I_{PCC}$ indicates the measured current at the point of common coupling (PCC), and $\alpha$ indicates the phase angle between the measured voltage at the point of common coupling (PCC) and the measured current at the point of common coupling (PCC).

19. The apparatus of claim 17,
wherein the resistive part (R) of the grid impedance ($Z_G$), the reactive part (X) of the grid impedance ($Z_G$) and the grid voltage ($V_G$) are determined by solving the following equation for three different working points:

$$(V_G)^2 = |V_{PCC}(i)|^2 + (R^2+X^2)\cdot\frac{(P^2(i)+Q^2(i))}{|V_{PCC}(i)|^2} - 2\cdot(R*P(i)+X*Q(i)),$$

$$i = 1, 2, 3$$

wherein $V_{PCC}$ indicates the voltage at the point of common coupling (PCC), P indicates the active power injected at the point of common coupling (PCC) being determined as a function of the phase angle, and Q indicates the reactive power injected at the point of common coupling (PCC) being determined as a function of the phase angle.

* * * * *